United States Patent
Tan et al.

(10) Patent No.: US 7,982,375 B2
(45) Date of Patent: Jul. 19, 2011

(54) INTEGRATED ACTUATOR SENSOR STRUCTURE

(75) Inventors: Xiaobo Tan, East Lansing, MI (US); Ning Xi, Okemos, MI (US); Zheng Chen, Charlottesville, VA (US); Yantao Shen, Reno, NV (US)

(73) Assignee: Board of Trustees of Michigan State University, East Lansing, MI (US)

( * ) Notice: Subject to any disclaimer, the term of this patent is extended or adjusted under 35 U.S.C. 154(b) by 0 days.

(21) Appl. No.: 12/519,099

(22) PCT Filed: Dec. 12, 2007

(86) PCT No.: PCT/US2007/025381
§ 371 (c)(1),
(2), (4) Date: Jan. 14, 2010

(87) PCT Pub. No.: WO2008/076271
PCT Pub. Date: Jun. 26, 2008

(65) Prior Publication Data
US 2010/0109595 A1    May 6, 2010

Related U.S. Application Data

(60) Provisional application No. 60/874,552, filed on Dec. 13, 2006.

(51) Int. Cl.
*H01L 41/04* (2006.01)
(52) U.S. Cl. ........ 310/800; 310/318; 310/319; 310/328; 310/330; 310/331; 310/332

(58) Field of Classification Search .................. 310/318, 310/319, 328, 338, 800, 330–332
See application file for complete search history.

(56) References Cited

U.S. PATENT DOCUMENTS

| 2007/0247033 A1* | 10/2007 | Eidenschink et al. | 310/800 |
| 2008/0061656 A1* | 3/2008 | Kim | 310/330 |
| 2009/0127980 A1* | 5/2009 | Asai | 310/333 |

OTHER PUBLICATIONS

Chen, Zheng, et al.: "Hybrid IPMC/PVDF structure for simultaneous actuation and sensing", Proceedings of SPIE—The International Society for Optical Engineering; Smart Structures and Materials 2006: Electroactive Polymeer Actuators and Devices (EAPAD) 2006; San Diego, CA, USA, Feb. 27-Mar. 2, 2006; SPIE, Bellingham, WA, vol. 6168, Mar. 2006, pp. 61681L1-61681L9, XP002481105.

(Continued)

*Primary Examiner* — Thomas M Dougherty
(74) *Attorney, Agent, or Firm* — Harness, Dickey & Pierce, P.L.C.

(57) ABSTRACT

An integrated sensory actuator (10) which uses an electroactive polymer is provided. The sensory actuator is comprised of an actuating member (12) made of an ionic polymer-metal composite; a sensing member (14) made of a piezoelectric material; and an insulating member (16) interposed between the actuating member and the sensing member. The sensory actuator may further include a compensation circuit adapted to receive a sensed signal from the sensing member and an actuation signal from the actuating member and compensate the sensed signal for feedthrough coupling between the actuating member and the sensing member.

32 Claims, 19 Drawing Sheets

OTHER PUBLICATIONS

Punning, Andres, et al.: "Empirical model of a bending IPMC actuator", Proceedings of SPIE—The International Society for Optical Engineering; Smart Structures and Materials 2006: Electroactive Polymer Actuators and Devices (EAPAD) 2006; San Diego, CA, USA, Feg. 27-Mar. 2, 2006; SPIE, Bellingham, WA, vol. 6168, Mar. 2006, pp. 61681V1-61681V8, XP002442092; ISSN: 0277-786X.

Bonomo, C. et al.: "A sensor-actuator integrated system based on IPMCs", Sensors, 2004, Proceedings of IEEE Vienna, Austria, Oct. 24-27, 2004, Piscataway, NJ, USA, IEEE, Oct. 24, 2004, pp. 489-492, XP010793442; ISBN: 978-0-7803-8692-1.

* cited by examiner

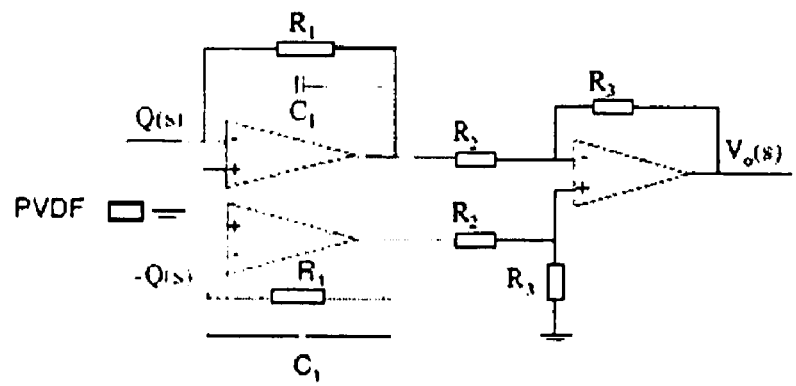
Fig. 2
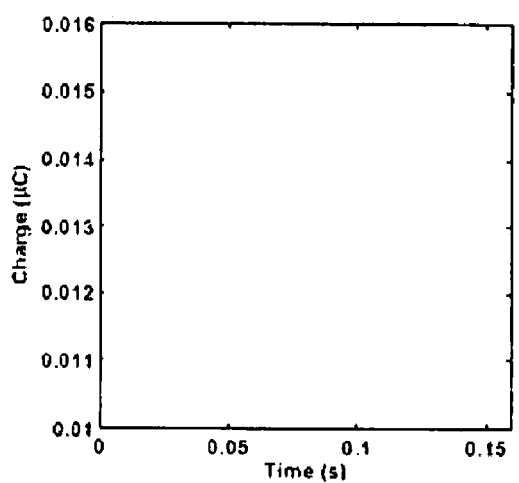 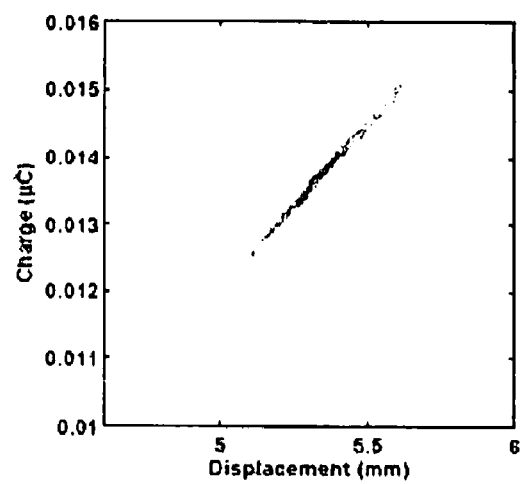
Fig. 3A					Fig. 3B

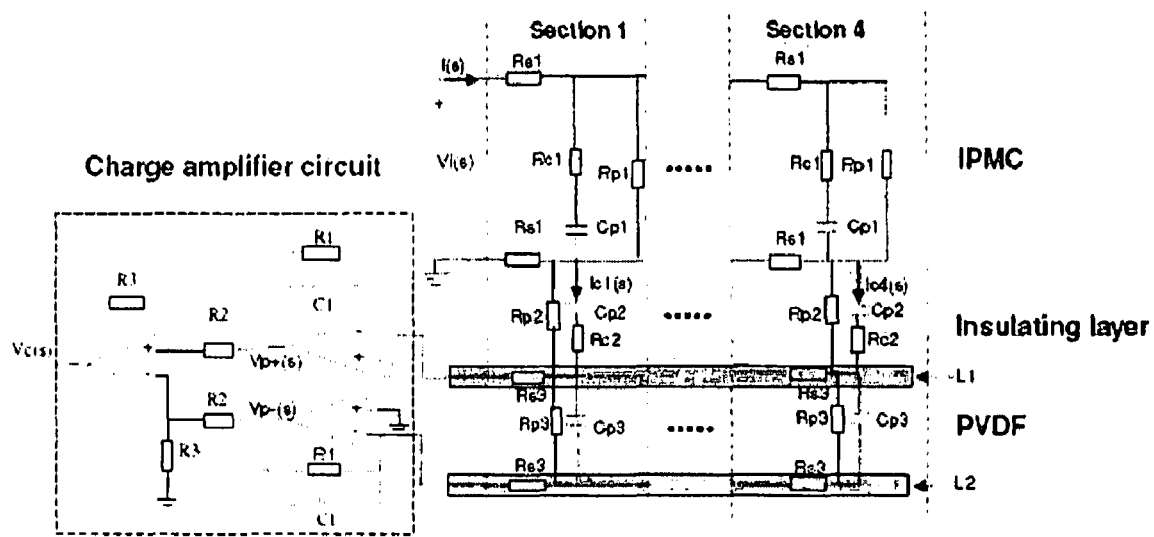
Fig. 8
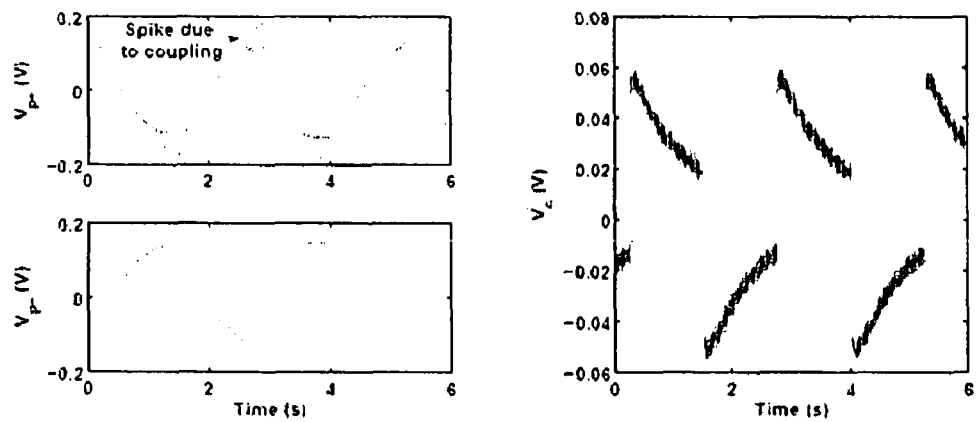
Fig. 9A
Fig. 9B

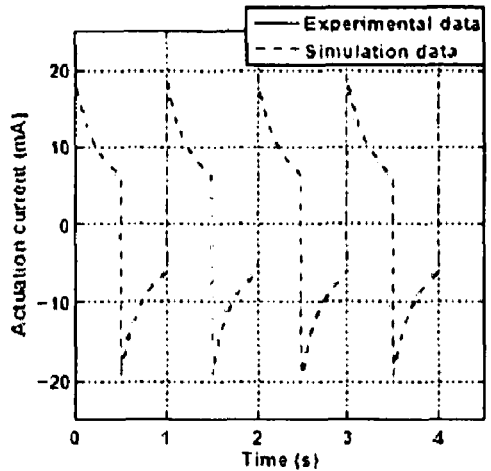
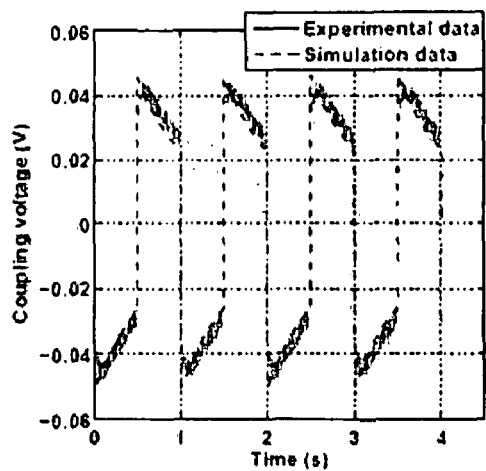
Fig. 10A  Fig. 10B
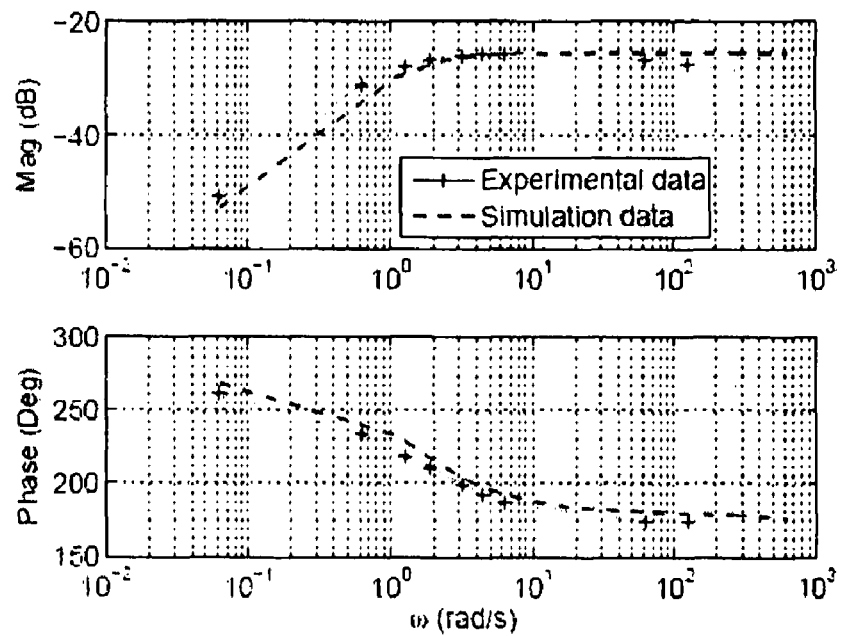
Fig. 11

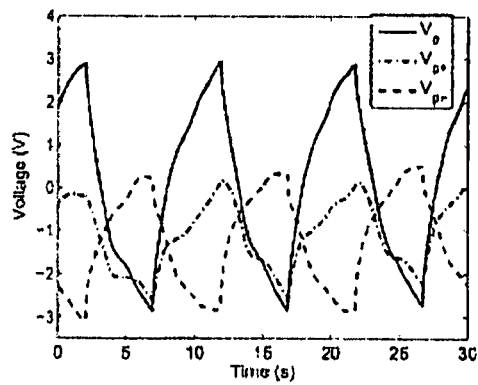
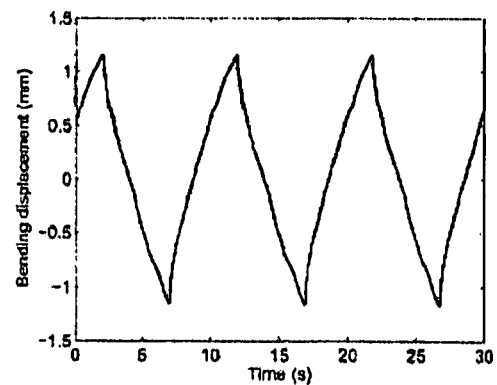
Fig. 23A          Fig. 23B
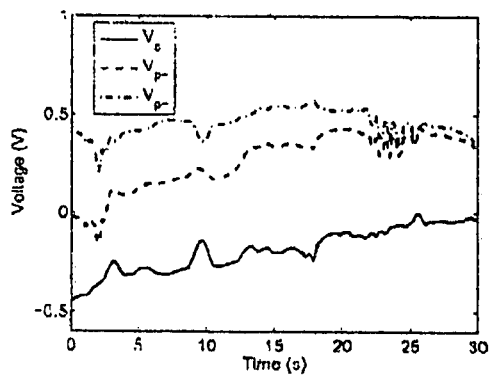
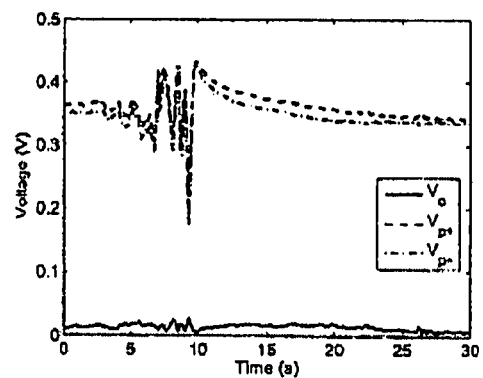
Fig. 24A          Fig. 24B

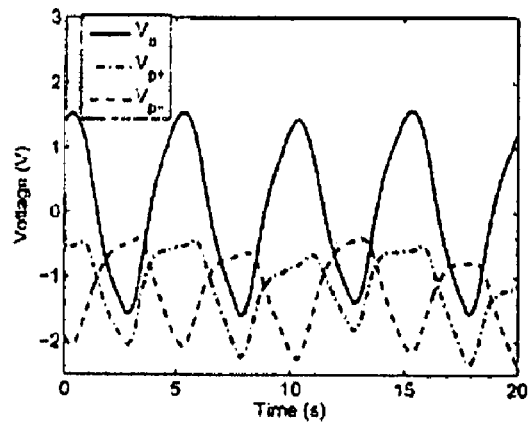 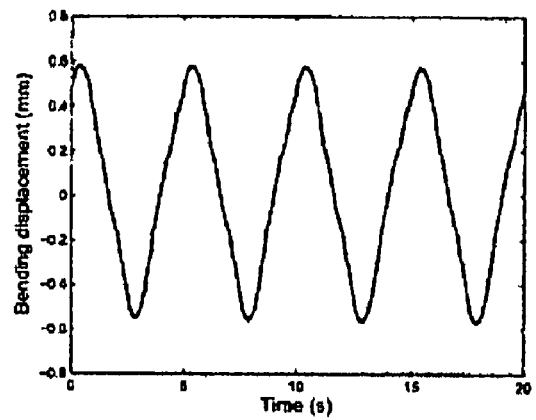
Fig. 25A	Fig. 25B
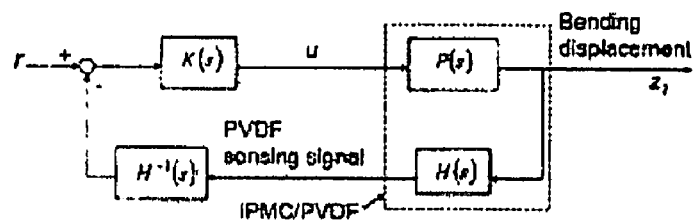
Fig. 26

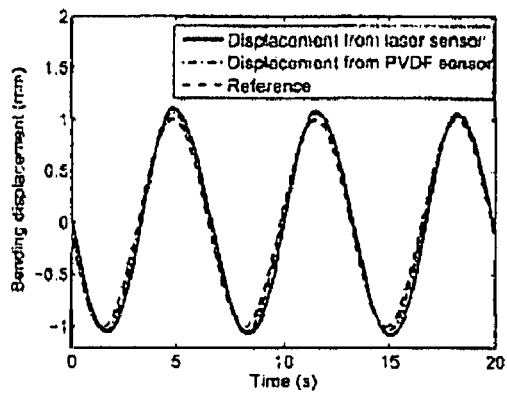
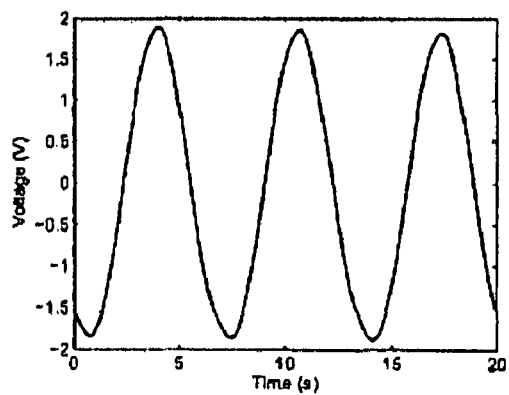
Fig. 27A			Fig. 27B
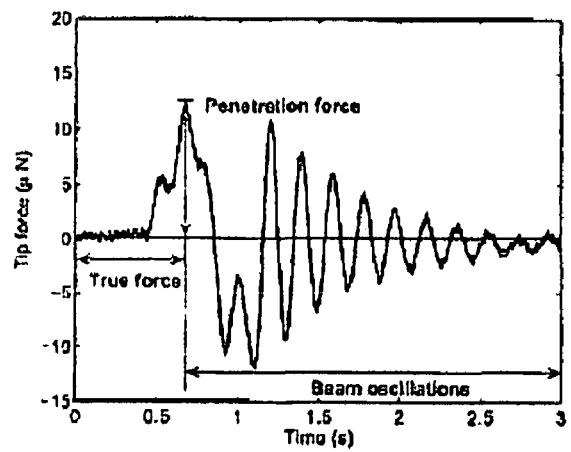
Fig. 28

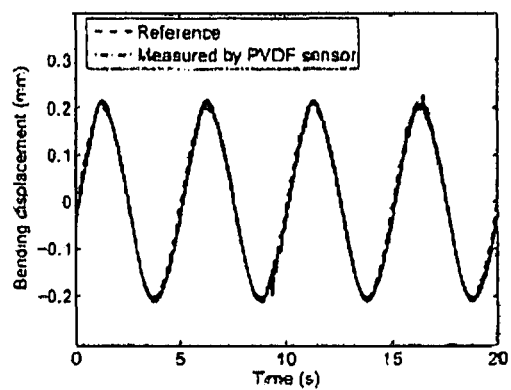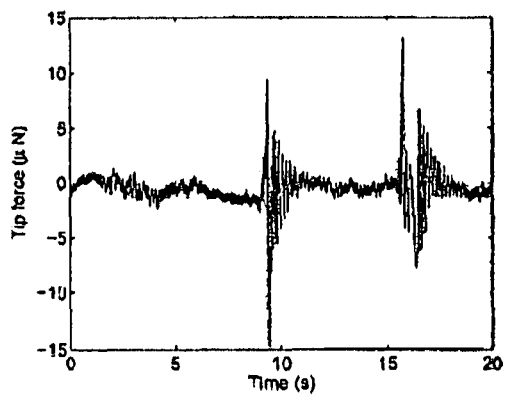
Fig. 30A　　Fig. 30B
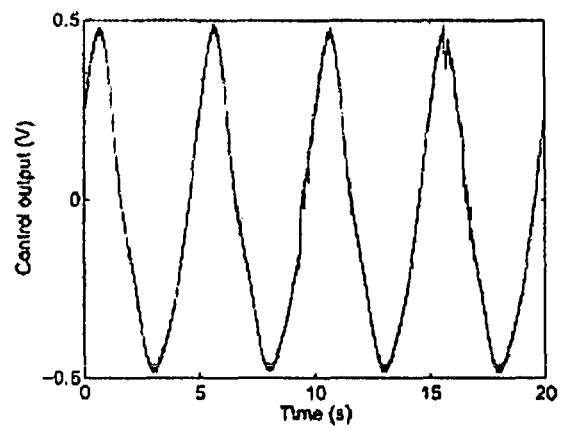
Fig. 30C

INTEGRATED ACTUATOR SENSOR STRUCTURE

CROSS-REFERENCE TO RELATED APPLICATIONS

This application is a U.S. National Stage Application of International application No. PCT/US2007/025381, filed Dec. 12, 2007. This application claims the benefit of U.S. Provisional Application No. 60/874,552, filed Dec. 13, 2006. The disclosure(s) of the above applications are incorporated herein by reference.

GOVERNMENT RIGHTS

The U.S. Government may have a paid-up license in this invention, and may have the right, in limited circumstances, to require the patent owner to license others on reasonable terms as identified by the terms of Federal Grant Nos. CMS 0550651 and ECS 0547131 awarded by the National Science Foundation.

FIELD

The present disclosure relates generally to an integrated actuator-sensor structure which uses an electroactive polymer for actuation and a piezoelectric polymer for sensing.

BACKGROUND

Ionic polymer-metal composites (IPMCs) form an important category of electroactive polymers which has both built-in actuation and sensing capabilities. Due to their large bending displacement, low driving voltage, resilience, and biocompatibility, IPMCs have been explored for potential applications in biomimetic robotics, medial devices, and micromanipulators. In most of these applications, compact sensing schemes are desired for feedback control of IPMC actuators to ensure precise and safe operation without using bulky, separate sensors. It is intriguing to utilize the inherent sensory property of an IPMC to achieve simultaneous actuation and sensing, like the self-sensing scheme of piezoelectric materials. However, this approach is difficult to implement due to the very small magnitude of the sensing signal compared to the actuation signal (millivolts versus volts) and the nonlinear, dynamic sensing responses. The idea of using two IPMCs, mechanically coupled in a side-by-side or bilayer configuration, to perform actuation and sensing has been explored. The attempt was reported to be unsuccessful since the sensing signal was buried in the feedthrough coupling signal from actuation.

Therefore, it is desirable to develop an integrated, compact sensing method for electroactive polymers which provides accurate, sensitive measurement of displacement and/or force output and does not appreciably compromise the actuation performance of the actuator with significant added weight or size. The method should provide precise sensory feedback to the actuator, thereby enabling the actuator to deliver exactly the desired displacement or force through closed-loop feedback control.

The statements in this section merely provide background information related to the present disclosure and may not constitute prior art.

SUMMARY

An integrated sensory actuator which uses an electroactive polymer is provided. Specifically, the sensory actuator is comprised of an actuating member made of an ionic polymer-metal composite; a sensing member made of a piezoelectric material; and an insulating member interposed between the actuating member and the sensing member. The sensory actuator may further include a compensation circuit adapted to receive a sensed signal from the sensing member and an actuation signal from the actuating member and compensate the sensed signal for feedthrough coupling between the actuating member and the sensing member.

Another structure for a sensory actuator is also proposed. The sensory actuator is comprised of an actuating member in a form of a plate and made of an electroactive polymer; two sensing members made of a piezoelectric material and disposed on opposing surfaces of the actuating member from each other; and an insulating layer interposed between each of the sensing members and the actuating member. The sensory actuator may be coupled with a force sensor.

Further areas of applicability will become apparent from the description provided herein. It should be understood that the description and specific examples are intended for purposes of illustration only and are not intended to limit the scope of the present disclosure.

DRAWINGS

FIG. 2 is a schematic of an exemplary differential charge amplifier;

FIGS. 3A and 3B are graphs illustrating charge output of the PVDF corresponding to the damped vibration and charge output versus the bending displacement, respectively;

FIG. 8 is a circuit model for the exemplary sensori-actuator structure;

FIGS. 9A and 9B are graphs showing sensing signals and an extracted coupling signal;

FIGS. 10A and 10B are graphs comparing simulation results based on the circuit model with experimental results;

FIG. 11 shows Bode plots of the derived transfer function;

FIGS. 23A and 23B are graphs showing PVDF sensing signals and bending displacement of the actuator beam tip measured by a laser sensor, respectively;

FIGS. 24A and 24B are graphs showing the sensing noise when the sensory actuator is placed in an open field and inside a conductive shielding enclosure, respectively;

FIGS. 25A and 25B are graphs showing sensing signals under a sinusoidal actuation signal and actual bending displacement of the sensory actuator beam tip as measured by a laser sensor, respectively;

FIG. 26 is a diagram of an exemplary closed-loop system for control of bending displacement;

FIGS. 27A and 27B are diagrams showing the bending displacement and actuation voltage, respectively, when sensory actuator is subject to feedback control;

FIG. 28 is a graph showing the force sensor response during an exemplary measurement sequence;

FIGS. 30A-30C are graphs showing the bending displacement of the actuator beam, force sensor output and the actuation voltage generated by a feedback controller during the measurement sequence.

The drawings described herein are for illustration purposes only and are not intended to limit the scope of the present disclosure in any way.

DETAILED DESCRIPTION

Figure 1A:
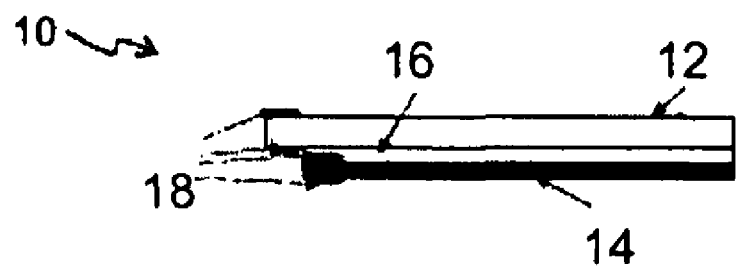
FIGS. 1A-1C illustrate an exemplary actuator from a side view, top view and front view, respectively.
Figure 1B:
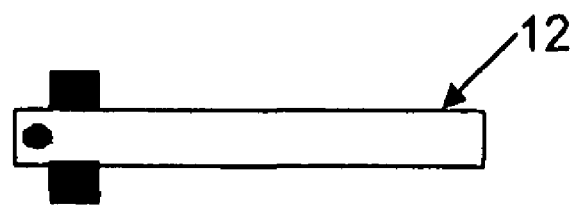
Figure 1C:
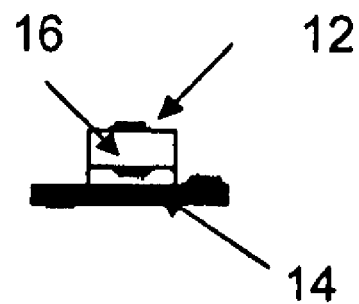

FIGS. 1A-1C illustrates an exemplary actuator 10. The actuator 10 is comprised generally of: an actuating member 12 made of an electroactive polymer; a sensing member 14 made of a piezoelectric material; and an insulating member 16 interposed between the actuating member 12 and the sensing member 14.

In the exemplary embodiment, the electroactive polymer is further defined as an ionic polymer-metal composite (IPMC). Different IPMC materials, having different dimensions, can be used. Such materials are commercially available from Environmental Robots Inc. Other types of electroactive polymers are contemplated by the broader aspects of this disclosure.

Likewise, different piezoelectric materials and different insulating materials can be used. In the exemplary embodiment, the sensing member is a polyvinylidene fluoride material; whereas, the insulating member is a polyvinyl chloride or polyester film. Other types of materials are also contemplated by this disclosure.

Electrodes 18 are formed on the different members. In an exemplary embodiment, the electrodes 18 are made from conductive epoxy to achieve low electrode's resistance and strong connection. Other types of conductive glues are also contemplated by this disclosure.

To construct the actuator, the IPMC may be bonded to one side of the insulating member and the piezoelectric material bonded to the opposing side of the insulating member. In an exemplary embodiment, a fast-cure elastic epoxy commercially available from Polysciences Inc. is used for bonding. Other bonding techniques, such as double-sided adhesive tape, may be used. Contact electrodes are formed on both sides of IPMC for applying the actuation voltage thereto. Similarly, electrodes are formed on the sensing member for measuring the electric charged generated thereon.

When the IPMC/PVDF structure is bent due to IPMC actuation or external forces, charges are generated on the PVDF, which can be measured by a charge amplifier. FIG. 2 shows an exemplary differential charge amplifier which can minimize the common-mode noise. The transfer function of the charge amplifier is described by:

$$\frac{V_o(s)}{Q(s)} = \frac{2R_1 s}{1 + R_1 C_1 s} \frac{R_3}{R_2}, \qquad (1)$$

which is a high-pass filter. As $R_1 \to \infty$, the transfer function $$\frac{V_o(s)}{Q(s)} \to \frac{2R_3}{C_1 R_2}.$$

However, in the circuit implementation, $R_1$ cannot be infinitely large because the bias current of the operational amplifier will saturate the signal output. To accommodate the actuation bandwidth of IPMC (typically below 10 Hz), the $R_1$ and $C_1$ values in the circuit are properly chosen so that the cutoff frequency of the charge amplifier is sufficiently low. Fox example, by picking $R_1 = 5000$ M$_\Omega$ and $C_1 = 1350$ pF, a cutoff frequency of 0.023 Hz is achieved.

Basically, the charge Q(s) generated by the PVDF is proportional to the bending displacement Z(s) of the beam:

$$Q(s) = GZ(s), \qquad (2)$$

where the constant G depends on the transverse piezoelectric coefficient $d_{31}$, the geometry of the composite beam, and the Young's modui of individual layers. By combining (1) and (2), one can obtain the transfer function from Z(s) to $V_o(s)$. A laser displacement sensor (OADM 20I6441/S14F, Baumer Electric) is used for both calibration of the PVDF sensor and validation of the sensing approach. In order to test the charge amplifier circuit, the IPMC/PVDF beam with one end fixed is tapped and then the laser sensor is used to detect the damped vibration of the beam. The measured vibration frequency is 42 Hz, which is much higher than the cutoff frequency of the charge amplifier. FIG. 3(a) shows the charge output of PVDF corresponding to the damped vibration, and FIG. 3(b) demonstrates that the charge signal is almost linear with respect to the bending displacement. These experimental results have validated the performance of the charge amplifier circuit. However, other circuit configurations for the charge amplifier are also contemplated.

The additional PVDF and insulating layers make the composite beam stiffer than the IPMC layer itself. It is of interest to understand the impact of this stiffening effect on the bending performance since this will be useful for the optimal IPMC/PVDF structure design. The investigation is conducted by combining analytical modeling, finite element computation, and experiments. Design optimization here is concentrated on the thickness of the insulating layer, but the approach can be used for the design of other parameters, such as the type of material for the insulating layer and the dimensions for IPMC and PVDF.

Figure 4:
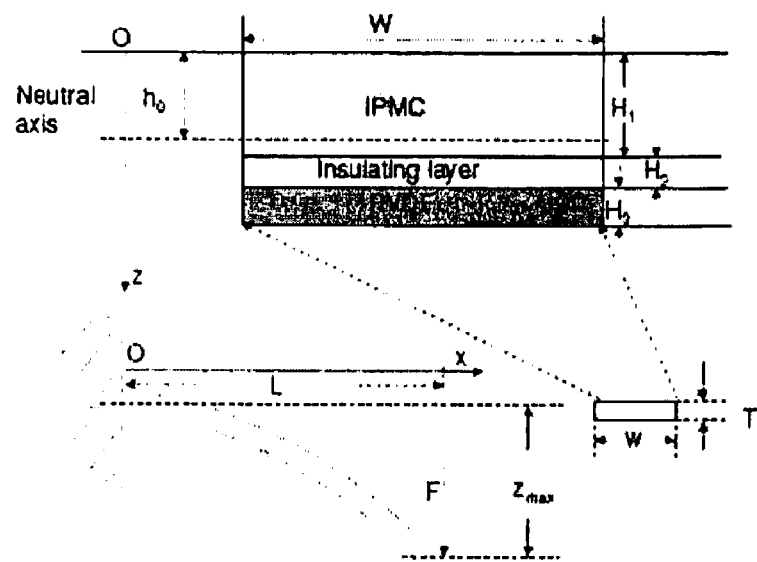
FIG. 4 is a diagram illustrating a schematic of the sensori-actuator structure.

FIG. 4 is a diagram of the actuator structure and the notation used in the following discussion. The beam stiffness can be characterized by its spring constant $$K = \frac{F}{z_{max}} \qquad (3)$$

where F is a quasi-static transverse force applied at the free end of the cantilever beam and $z_{max}$ is the corresponding displacement at the acting point. The spring constant can be calculated analytically using composite beam theory. In FIG. 4, the position of the mechanical neutral axis of the composite is given by:

$$h_0 = \frac{\sum_{i=1}^{3} E_i H_i C_i}{\sum_{i=1}^{3} E_i H_i}. \qquad (4)$$

Here $E_1$, $E_2$ and $E_3$ are the Young's moduli of IPMC, insulating layer, and PVDF, respectively. $H_1$, $H_2$ and $H_3$ are the thickness of those layers. $C_1$, $C_2$ and $C_3$ are the positions of the central axes of the layers, which can be calculated as:

$$C_1 = H_1/2, \; C_2 = H_1 + H_2/2, \; C_3 = H_1 + H_2 + H_3/2. \qquad (5)$$

The distance between the central axis and the neutral axis can be written as:

$$d_i = |C_i - h_0|, \text{ for } i = 1, 2, 3. \qquad (6)$$

The moment of inertia of each layer is:

$$I_i = \frac{1}{12} W H_i^3 + W H_i d_i^2, \text{ for } i = 1, 2, 3. \qquad (7)$$

From the moment balance equation, $$M = \frac{\sum_{i=1}^{3} E_i I_i}{\rho(x)} = F(L - x), \qquad (8)$$

where $\rho(x)$ is the radius of curvature. For small bending, the radius of curvature can be given by:

$$\frac{1}{\rho(x)} = \frac{d^2 z}{dx^2}, \qquad (9)$$

where z(x) denotes the deflection of the beam along the length of x. With the boundary condition $z(0)=0$ and $z'(0)=0$, one gets $$z(x) = \frac{F}{\sum_{i=1}^{3} E_i I_i} \left( \frac{Lx^2}{2} - \frac{x^3}{6} \right). \qquad (10)$$

Evaluating z at x=L yields the expression of spring constant $$K = \frac{F}{z_{max}} = \left( \frac{3 \sum_{i=1}^{3} E_i I_i}{L^3} \right). \qquad (11)$$

Figure 5:
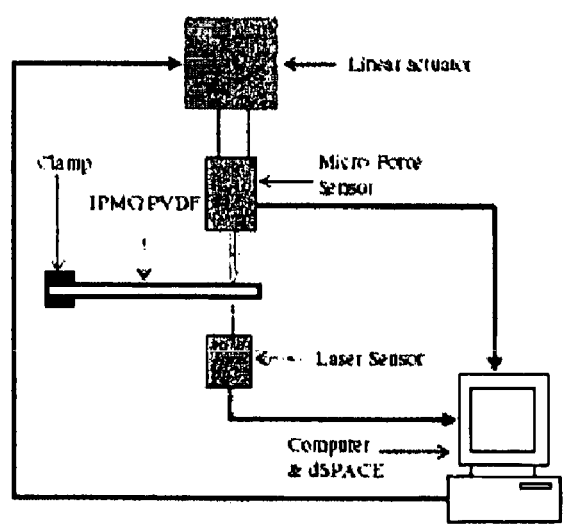
FIG. 5 is a diagram illustrating an experimental setup for spring constant measurements.

Experiments are conducted to measure and compare the spring constants of the IPMC and IPMC/PVDF beams. FIG. 5 illustrates the diagram of the experimental setup. The IPMC or IPMC/PVDF beam is clamped at one end and is pushed by the tip of a calibrated micro-force sensor which is mounted on a linear actuator. The sensitivity of the micro force sensor is 9.09 mV/μN±6.5% and its spring constant is 0.264 N/m. A laser displacement sensor measures the bending displacement of the beam $z_{max}$ under the pushing force F. A 20× microscope (FS60, Mitutoyo) is used to monitor the experiments. Measurements are conducted for an IPMC beam and two IPMC/PVDF beams which have insulating layers in different thickness (IPMC/PVDF1 and IPMC/PVDF2). Detailed beam dimensions can be found in the following table:

| Beams | IPMC | IPMC/PVDF1 | IPMC/PVDF2 |
|---|---|---|---|
| W (mm) | 7.3 | 8.2 | 7.6 |
| L (mm) | 37.2 | 36.0 | 33.0 |
| $H_1$ (μm) | 355 | 340 | 350.0 |
| $H_2$ (μm) |  | 30.0 | 100.0 |
| $H_3$ (μm) |  | 30.0 | 30.0 |
| $K_{mea}$ (N/m) | 0.906 | 2.283 | 4.676 |
| $K_{FEA}$ (N/m) | 0.908 | 2.286 | 4.647 |

Figure 6:
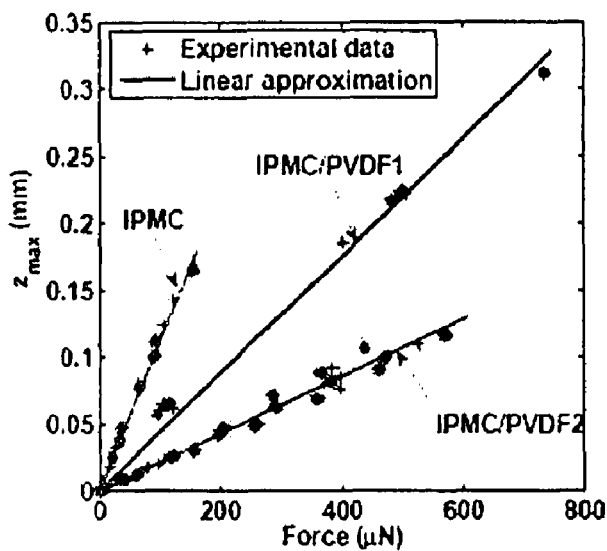
FIG. 6 is a graph showing the measured displacement versus force data and the linear approximations, from which the spring constants can be calculated.

FIG. 6 shows the measured displacement versus force data and the linear approximations, from which the spring constants can be calculated. From the experimental data the Young's moduli of individual layers can be identified as: $E_1$=0.571 GPa, $E_2$=0.73 GPa, $E_3$=1.96 GPa.

To validate the linear analysis above, more accurate finite-element computation is conducted using CoventorWare commercially available software, where the identified parameters are used together with the given geometric dimensions. The spring constants are calculated based on the free-end deflection of beams when they are subjected to an external force F=20 μN at the tip. Table above lists the spring constants obtained through experimental measurement (Kmea) and the finite element analysis ($K_{FEA}$) for the different beams. The close agreement between $K_{mea}$ and $K_{FEA}$ validates the model and analysis.

As shown in table above, the thicker the insulator, the stiffer the IPMC/PVDF structure. In order to optimize the bending performance of the IPMC/PVDF structure, one should select the elastic insulating layer as soft and thin as possible. However, thinner insulating layer may result in stronger electrical feedthrough coupling. In our design, the thickness of the insulating layer is chosen to be 30 μm to achieve tradeoff between the two considerations.

Figures 7A, 7B:
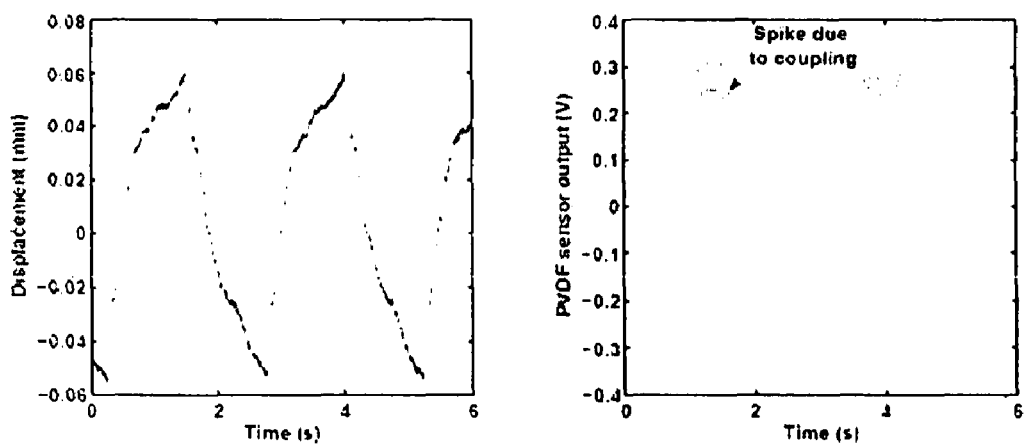
FIGS. 7A and 7B are graphs showing the bending displacement detected by a laser sensor and the output from the charge amplifier, respectively.

Since the PVDF film is closely bonded to the IPMC with a very thin insulating PVC film, the coupling capacitance between the IPMC and the PVDF results in the electric feedthrough effect during simultaneous actuation and sensing. When the actuation signal is applied to the IPMC, the actuation voltage generates coupling current going through the insulating layer and then induces coupling charges on the PVDF. As a result, the charge amplifier gathers both the sensing and coupling charges from the PVDF. The presence of feedthrough coupling is illustrated by applying a 0.4 Hz square-wave actuation input (peak-to-peak 1.4 V). In the experiment, the humidity is 34% and the temperature is 23° C. FIG. 7A shows the bending displacement detected by the laser sensor, while FIG. 7B shows the output from the charge amplifier. The spikes in the PVDF sensor output arise from the capacitive coupling between the IPMC and PVDF layers when the actuation voltage jumps.

A complete circuit model of the IPMC/PVDF structure is developed to understand and capture the feedthrough coupling dynamics as shown in FIG. 8. The model includes the equivalent circuits for individual layers and their natural couplings. Due to the non-negligible resistances resulted from the porous surface electrodes of the IPMC, the voltage potential is not uniform along the IPMC length. A distributed transmission-line type model is thus proposed. The overall circuit model is broken into discrete elements along its length for parameter identification and simulation purposes. In this disclosure, the circuit model is chosen to have four sections of identical elements. The surface resistance of IPMC is represented by $R_{s1}$, while other key electrodynamic processes (e.g., ionic transport, polymer polarization, and internal resistance) are reflected in the shunt element consisting of resistor $R_{c1}$ and capacitor $C_{p1}$. The polymer resistance is described by $R_{p1}$. In the circuit model of the insulating layer, $R_{p2}$, $C_{p1}$, $R_{c2}$ are resistances and capacitances between the IPMC and PVDF. In the circuit model of the PVDF, $R_{s3}$ is the surface resistance of PVDF and $R_{p3}$, $C_{p3}$ represent the resistance and capacitance between the electrodes of the PVDF.

In order to identify the circuit parameters, the impedances are measured at multiple frequencies. The impedances of each layer are nonlinear functions of the resistances and capacitances involved. The parameters are identified using the Matlab command nlinfit, which estimates the coefficients of a nonlinear function using least squares methods. Identified parameters n the circuit model are provided below:

| IPMC Layer | | Insulating Layer | | PVDF Layer | |
|---|---|---|---|---|---|
| $R_{s1}$ | 17 Ω | $R_{p2}$ | 500 MΩ | $R_{s3}$ | 0.1 Ω |
| $R_{c1}$ | 30 Ω | $C_{p2}$ | 42 pF | $R_{p3}$ | 600 MΩ |
| $C_{p1}$ | 3 mF | $R_{c2}$ | 4.5 MΩ | $C_{p3}$ | 290 pF |
| $R_{p1}$ | 25 KΩ | | | | |

The proposed circuit model will be validated by comparing its prediction of the feedthrough coupling signal with experimental measurement. We first explain a simple method for measuring the coupling signal. We observe that due to the low surface resistance of PVDF, the electrode layer $L_1$ in FIG. 8 shields the coupling current from reaching the electrode layer $L_2$. This means that the feedthrough coupling signal does not exist in $V_{p-}$, which is related to the charge from the layer $L_2$. This statement is supported by the measurement, shown in FIG. 9A, where spikes only appear in $V_{p+}$. Since only $V_{p+}$ has the coupling component while the sensing components in $V_{p-}$ and $V_{p+}$ have a phase shift of 180°, the coupling signal is obtained as:

$$V_c = V_{p+} + V_{p-}. \qquad (12)$$

FIG. 9B shows the extracted coupling signal.

FIG. 10 compares Pspice simulation results based on the circuit model with experimental results when a 1 Hz square-wave actuation voltage is applied. Good agreement is achieved for both the actuation current in IPMC as shown in FIG. 10A and the coupling voltage $V_c$ as shown in FIG. 10B.

The transfer function from the actuation voltage to the coupling voltage can be derived from the circuit model. Since there are 14 capacitors in the circuit model, the transfer function will be $14^{th}$-order, which is not easy to implement in real time. After an order-reduction process, the transfer function of the coupling dynamics can be approximated by a $5^{th}$-order system:

$$T_c = \frac{-(509s^4 + 72s^3 + 1.5 \times 10^4 s^2 + 2203s)}{s^5 + 9525s^4 + 1.5 \times 10^4 s^3 + 2.9 \times 10^5 s^2 + 4.5 \times 10^5 s + 6 \times 10^4}. \qquad (13)$$

To further verify the coupling model, a sequence of sinusoidal voltage signals with frequency ranging from 0.01 Hz to 20 Hz are applied to the IPMC. Actuation voltages are measured and coupling signals are effectively extracted from $V_{p+}$ and $V_{p-}$ for the purpose of obtaining the empirical Bode plots of coupling dynamics. FIG. 11 shows that the Bode plots of the derived transfer function (13) match up-well with the measured Bode-plots.

Figure 12:
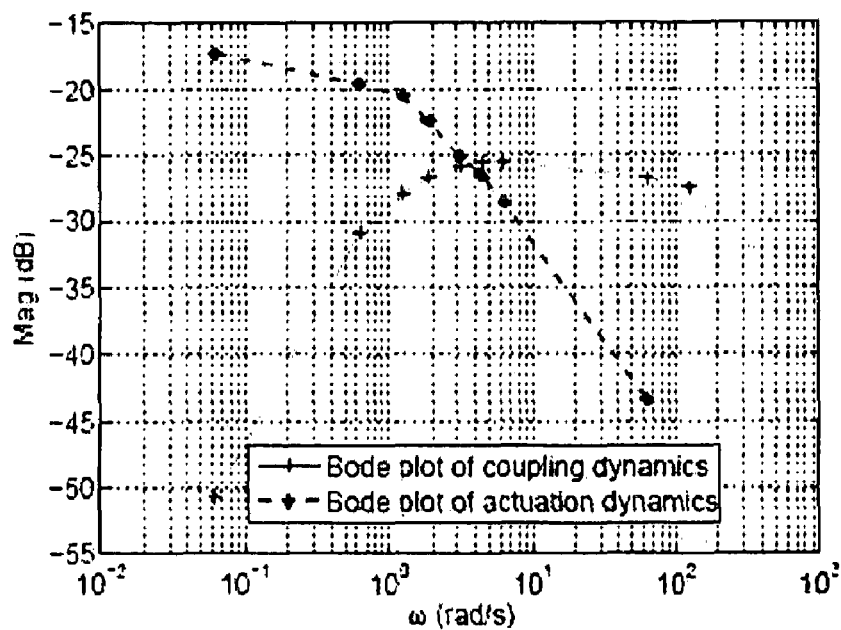
FIG. 12 shows Bode plots of coupling dynamics in relation to actuation dynamics.

There are several possible schemes to get rid of the coupling signal. Inserting another conductive layer between the IPMC and PVDF to shield the feedthrough coupling is one potential solution, but at the cost of increased stiffness and fabrication complexity. Another solution is to just use $V_{p-}$ as the sensing signal, but this signal-mode sensing scheme is sensitive to the common-mode noise in practice. Since the coupling dynamics has high-pass characteristics, one might also try to eliminate the coupling component with low-pass filtering. However, the relatively low cut-off frequency of the coupling dynamics, comparing to the actuation bandwidth (See FIG. 12), makes this approach infeasible.

Figure 13:
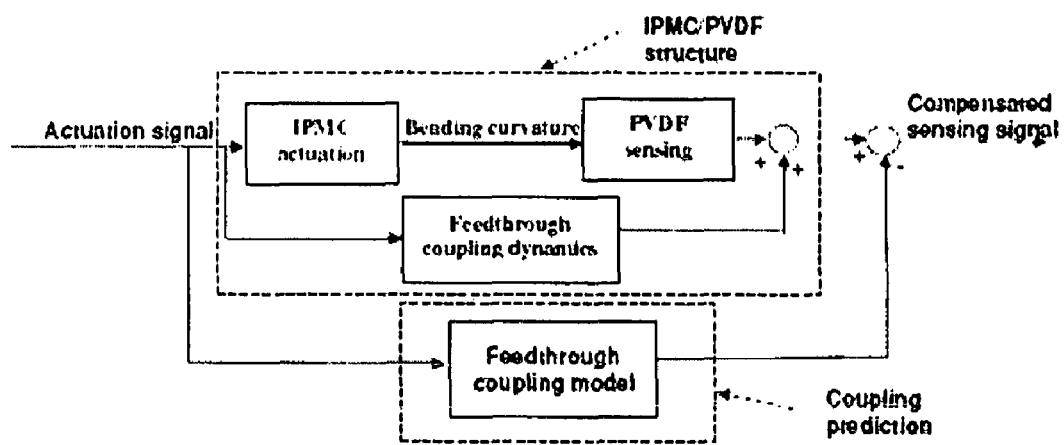
FIG. 13 is a diagram of an exemplary compensation scheme to remove feedthrough coupling.
Figure 14:
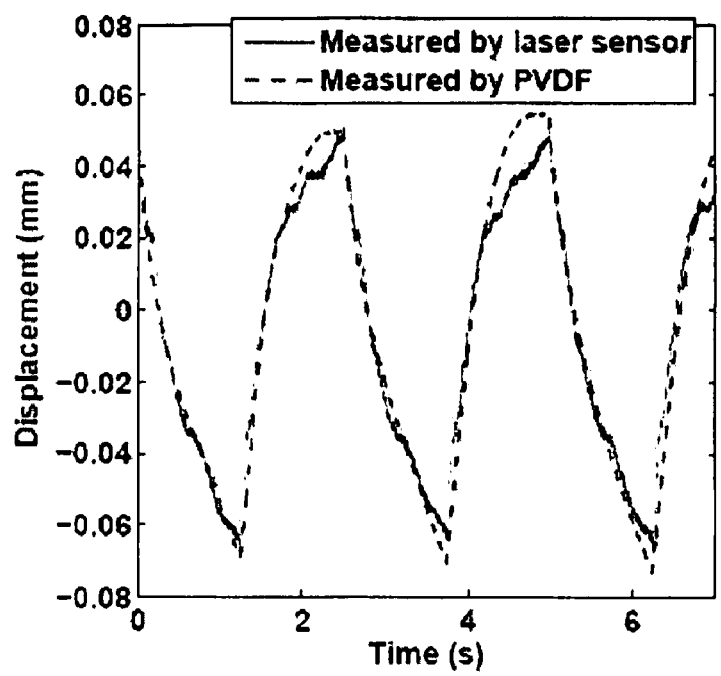
FIG. 14 is a graph comparing displacement measurements by a laser sensor with a PVDF sensor.

In this disclosure, a model-based real-time compensation scheme is further proposed to remove the feedthrough coupling component. The coupling charge is calculated from coupling circuit model (13). By subtracting it from the measured charge of the PVDF, the sensing charge can be extracted. FIG. 13 illustrates the compensation scheme. FIG. 14 compares the displacement measurement obtained from the PVDF sensor with that from the laser sensor when a 0.4 Hz square-wave actuation input is applied. It is seen that the spike related to the electrical coupling is removed by the compensation scheme. Although there is about 12% error shown in FIG. 14, the amplitudes and the phases agree well.

The developed IPMC/PVDF sensori-actuator can be applied to bio-manipulation, with one of the applications being the micro-injection of living *Drosophila* embryos. Such operations are important in embryonic research for genetic modification. Currently this process is implemented manually, which is time-consuming and has low success rate due to the lack of accurate control on the injection force, the position, and the speed. The IPMC/PVDF structure is envisioned to provide accurate force and position control in the micro-injection of living embryos, and thus to automate this process with a high yield rate. In this invention, an open-loop injection experiment with the IPMC/PVDF sensori-actuator can be conducted, and the process of the injection behavior can be captured by the PVDF sensor.

Figure 15:
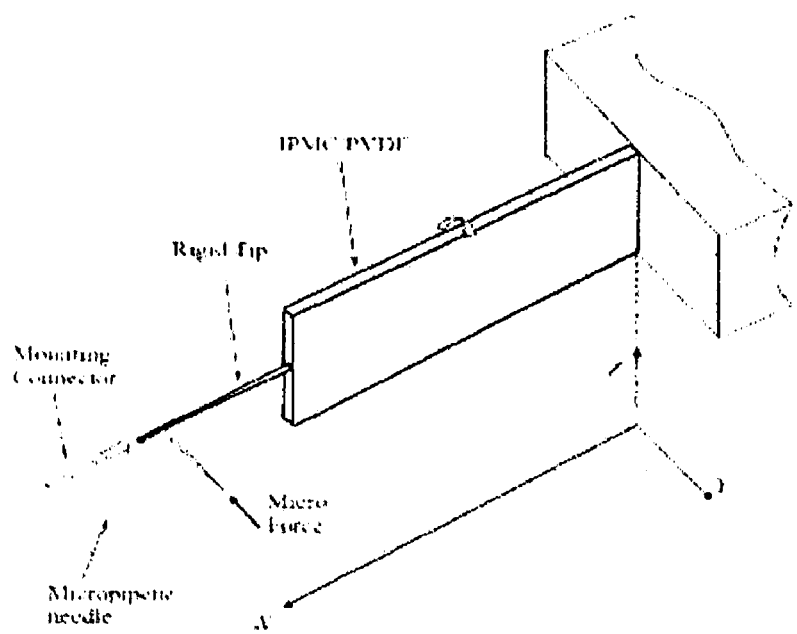
FIG. 15 is a diagram of an exemplary micro-force injector which employs the sensori-actuator.

FIG. 15 illustrates the proposed and preliminarily developed IPMC/PVDF micro-force injector. A micro pipette with an ultra-sharp tip (1.685 μm in diameter and 2.65° in angle), can be mounted at the end point of a rigid tip attached to the IPMC/PVDF structure.

Figure 16:
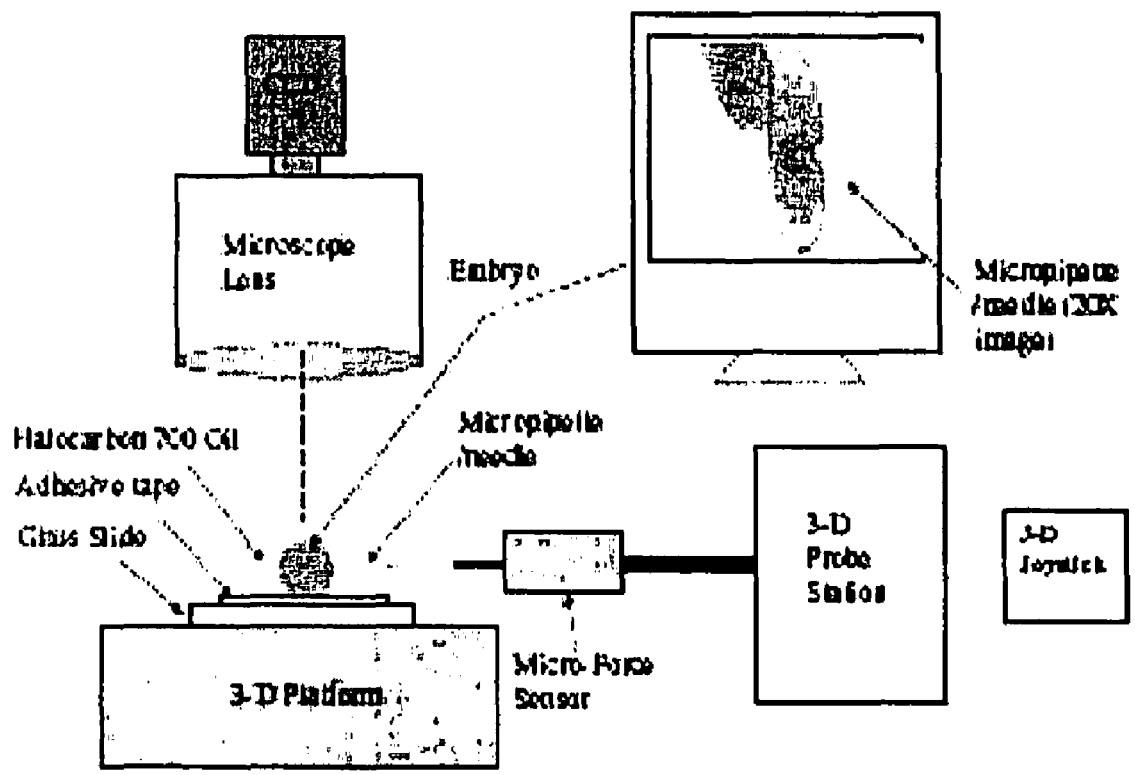
FIG. 16 is a diagram of an experimental setup for embryo injection.

As one of the bio-manipulation applications, injection of living *Drosophila* embryos has been implemented using the developed IPMC/PVDF sensori-actuator (sensorized micro injector). The dimensions of the embryos are variable with an average length of 500 μm and a diameter of about 180 μm. FIG. 16 is a diagram of the experimental setup for embryo injection. A 3-D precision probe station (CAP-945, Signatone), which is controlled by a 3-D joystick, moves the needle close to an embryo and then a ramp voltage, which starts from 0 V and saturates at 2 V, is applied to the IPMC. The IPMC drives the beam with the needle to approach the embryo. After the needle gets in contact with the membrane of the embryo, the latter will be deformed but not penetrated due to its elasticity. At this stage, the needle is still moving until the reaction force between the needle and embryo reaches the penetration force. The needle stops at the penetration moment for a while (about 0.2 ms) due to temporary force balance. After that, the embryo membrane is pene the needle moves freely into the embryo.

Figure 17A:
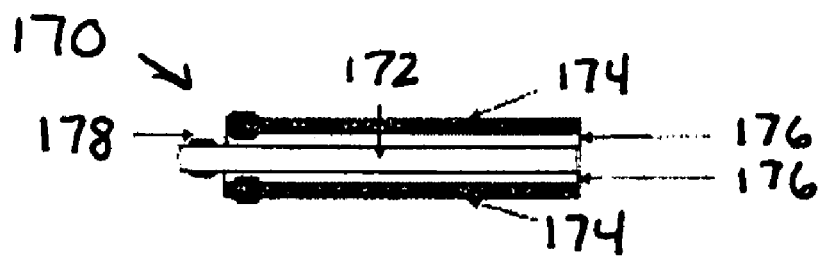
FIGS. 17A-17C are diagrams illustrating another exemplary sensory actuator from a side view, top view and front view, respectively.
Figure 17B:
Figure 17C:
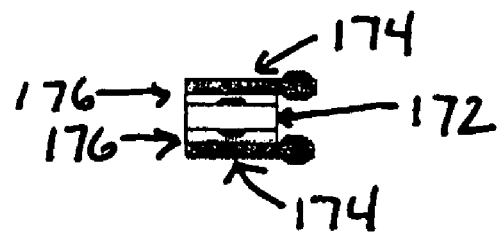

FIGS. 17A-17C illustrates an alternative design for an integrated sensory actuator which eliminates the need for feedthrough compensation and enables feedback control. The sensory actuator 170 is comprised of: an actuating member 172 in a form of a plate and made of an electroactive polymer; and two sensing members 174 made of a piezoelectric material and disposed on opposing surfaces of the actuating member 172 from each other. An insulating layer 176 is interposed between each of the sensing members and the actuating member.

In an exemplary embodiment, two complementary PVDF films, placed in opposite poling directions, are bonded to both sides of an IPMC with insulating layers in between. In our experiments, we have used 30 μm thick PVDF film from Measurement Specialties Inc., and 200 μm thick IPMC from Environmental Robots Inc. The IPMC uses non-water-based solvent and thus operates consistently in air, without the need for hydration. Scrapbooking tape (double-sided adhesive tape, 70 μm thick) from 3M Scotch Ltd. is used for both insulating and bonding purposes. Since we are focused on demonstrating the proof of the concept in this paper, the materials used are chosen mainly based on convenience. However, the models to be presented later will allow one to optimize the geometry design and material choice based on applications at hand.

Figure 18:
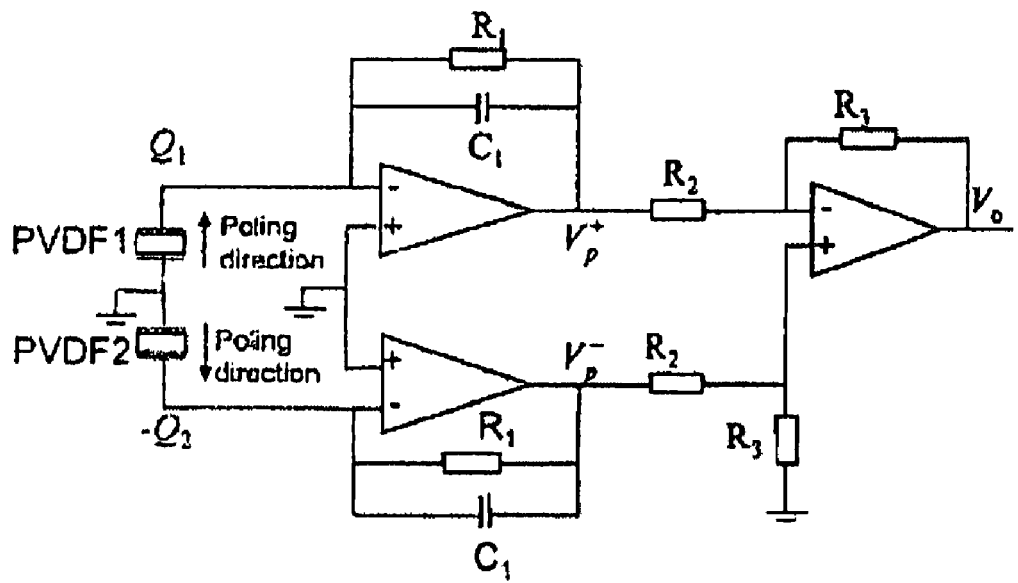
FIG. 18 is a schematic of an exemplary differential charge amplifier for use with the actuator.

FIG. 18 shows an exemplary differential charge amplifier used to measure the PVDF sensor output. In particular, the inner sides of two PVDF films are connected to the common ground while the outer sides are fed to the amplifiers. Let $Q_1(s)$ and $Q_2(s)$ be the charges generated on the upper PVDF and the lower PVDF, respectively, represented in the Laplace domain. The signals $V_p+$ and $V_p-$ in FIG. 18 are related to the charges by $$V_p+(s) = -\frac{R_1 s}{1+R_1 C_1 s} Q_1(s), \quad V_p-(s) = -\frac{R_1 s}{1+R_1 C_1 s} Q_2(s),$$

and the sensor output $V_0$ equals $$V_0(s) = \frac{R_1 R_3 s}{R_2(1+R_1 C_1 s)}(Q_1(s) - Q_2(s)). \tag{14}$$

Let the bending-induced charge be $Q(s)$ for the upper PVDF, and the common noise-induced charge be $Q_n(s)$. If the sensor response is symmetric under compression versus tension (more discussion on this below), one has $Q_1(s)=Q(s)+Q_n(s)$, $Q_2(s)=-Q(s)+Q_n(s)$, which implies $$V_0(s) = \frac{2R_1 R_3 s}{R_2(1+R_1 C_1 s)}(Q(s)), \tag{15}$$

and the effect of common noises (such as thermal drift and electromagnetic interference) is eliminated from the output. The charge amplifier is a high-pass filter. To accommodate the actuation bandwidth of IPMC (typically below 10 Hz), the $R_1$ and $C_1$ values in the circuit are properly chosen so that the cutoff frequency of the charge amplifier is sufficiently low. By picking $R_1$=5000 MΩ, $C_1$=1350 pF and $R_2$=$R_3$=10 kΩ, a cutoff frequency of 0.023 Hz is achieved.

Figure 19:
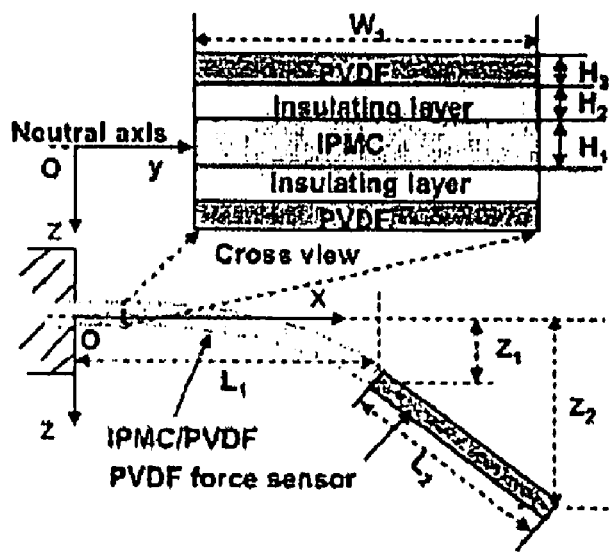
FIG. 19 is a diagram showing the geometric definitions associated with the sensory actuator.

With reference to FIG. 19, a model is developed for predicting the sensitivity of the bending sensor in terms of the design geometry and material properties. Suppose that the IPMC/PVDF beam has a small uniform bending curvature with tip displacement $z_1$; without external force, the force sensor beam attached at the end of IPMC/PVDF appears straight with tip displacement $z_2$. One would like to compute the sensitivity $$\frac{Q}{z_2},$$

where Q represents charges generated in one PVDF layer given the end-effector displacement $z_2$. With the assumption of small bending for IPMC/PVDF beam, the curvature can be approximated by $$\frac{1}{\rho} \approx \frac{2z_1}{L_1^2},$$

where ρ represents the radius of curvature. As $H_3 \ll 0.5H_1 + H_2$, we assume the stress inside the PVDF to be uniform and approximate it by the value at the center line of this layer:

$$\sigma_s = E_3 \epsilon = E_3 \frac{0.5H_1 + H_2 + 0.5H_3}{\rho} \tag{16}$$

where $E_3$ is the Young's modulus of the PVDF. The electric displacement on the surface of PVDF is $$D_2 = d_{31}\sigma_s, \tag{17}$$

where $d_{31}$ is the transverse piezoelectric coefficient. The total charge generated on the PVDF is then $$Q = \int D_2 dS = D_s L_1 W_1. \tag{18}$$

With (15), (16), (17) and (18), one can get $$Q = \frac{2d_{31} E_3 W_1 (0.5H_1 + H_2 + 0.5H_3) z_1}{L_1}. \tag{19}$$

The end-effector displacement $z_2$ is related to $z_1$ by $$z_2 = z_1 + L_2 \sin\left(\arctan\left(\frac{2z_1}{L_1}\right)\right) \approx z_1\left(1 + \frac{2L_2}{L_1}\right), \tag{20}$$

Combining (19) and (20), one can get the sensitivity $$S = \frac{Q}{z_2} = \frac{2d_{31} E_3 W_1 (0.5H_1 + H_2 + 0.5H_3)}{L_1 + 2L_2}. \tag{21}$$

Parameters measured or identified for the sensory actuator prototype are given in the table below.

| $W_1$ | $L_1$ | $H_1$ | $H_2$ | $H_3$ |
|---|---|---|---|---|
| 10 mm | 40 mm | 200 μm | 65 μm | 30 μm |

| $W_2$ | $L_2$ | $h_1$ | $h_2$ | $h_3$ |
|---|---|---|---|---|
| 6 mm | 30 mm | 200 μm | 65 μm | 30 μm |

| $E_1$ | $E_2$ | $E_3$ | $d_{31}$ |
|---|---|---|---|
| 5 GPa | 0.4 GPa | 2 GPa | 28 pC/N |

The sensitivity is predicted to be 1830 pC/mm, while the actual sensitivity is characterized to be 1910 pC/mm using a laser distance sensor (OADM 20I6441/S14F, Baumer Electric). With the charge amplifier incorporated, the sensitivity $$\frac{V_0}{z_2}$$

at frequencies of a few Hz or higher is measured to be 2.75 V/mm, compared to a theoretical value of 2.71 V/mm.

The sensory actuator described above may function alone or in combination with a force sensor as shown in FIG. 19. In an exemplary embodiment, the force sensor is in a form of a plate which extends lengthwise from an end of the sensory actuator, such that longitudinal surfaces of the sensory actuator and the force sensor are substantially coplanar with each other. Other configurations for the force sensor are contemplated by the disclosure.

Figure 20A:
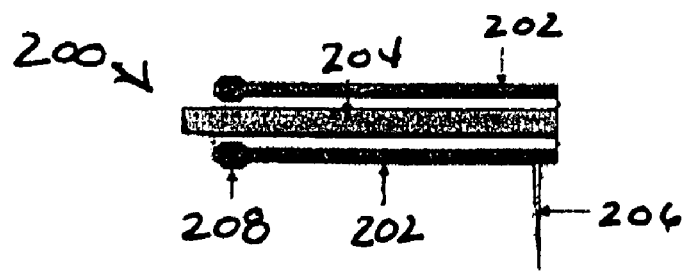
FIGS. 20A-20C are diagrams illustrating an exemplary force sensor.
Figure 20B:
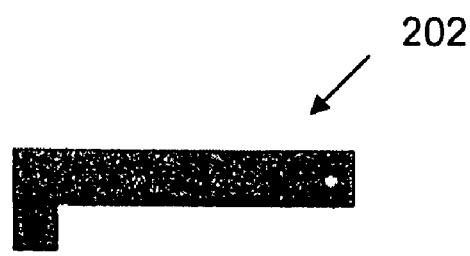
Figure 20C:
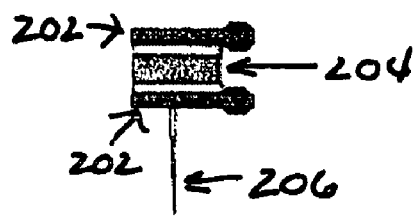

FIGS. 20A-20C illustrates that the force sensor 200 is structured in a similar manner to that of sensory actuator. For example, two PVDF films 202 are bonded to the both sides of a relatively rigid beam 204. In this example, 200 μm thick Polyester from Bryce Corp. is used for the beam. An end-effector, e.g., a glass needle 206 in microinjection applications, may be bonded the tip of the force sensor. An external force experienced by the end-effector will cause the composite beam to bend, which produces charges on the PVDF films. Another differential charge amplifier is needed to capture the output signal from the force senor. Other constructions for the force sensor are also contemplated by this disclosure.

Figure 21:
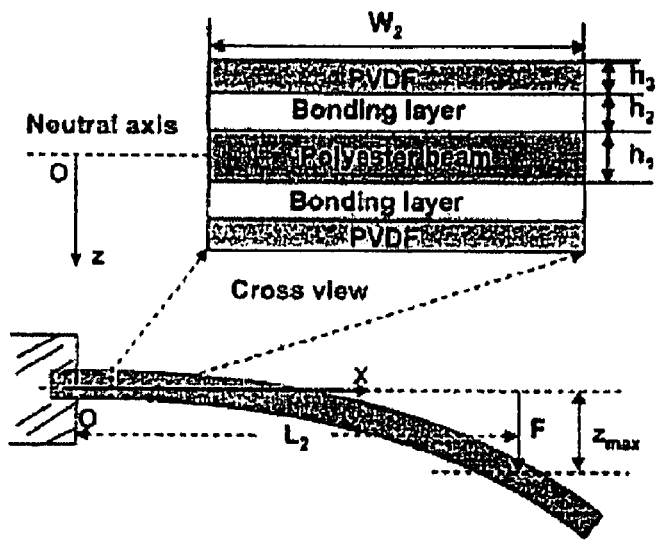
FIG. 21 is a diagram showing the geometric definitions associated with the force sensor.

With reference to FIG. 21, the sensitivity model for force sensing, $$\frac{Q_f}{F},$$

is provided below. Here $Q_f$ represents the charges generated in one PVDF in response to the force F exerted by the end-effector. The beam curvature can be written as $$\frac{1}{\rho(x)} = \frac{F(L_2 - x)}{\sum_{i=0}^{3} E_i I_i}, \quad (22)$$

where $\rho(x)$ denotes the radius of curvature at x, $E_1, E_2, E_3$ are the Young's moduli of the Polyester film, the bonding layer, and PVDF respectively. $I_1$, $I_2$ and $I_3$ are the moments of inertia for those layers, which are given by $$I_1 = \frac{1}{12} W_2 h_1^3,$$

$$I_2 = \frac{1}{6} W_2 h_2^3 + \frac{W_2 h_2 (h_1 + h_2)^2}{2},$$

$$I_3 = \frac{1}{6} W_2 h_3^3 + \frac{W_2 h_3 (h_1 + 2h_2 + h_3)^2}{2}.$$

The stress generated in the PVDF is approximately $$\sigma_3(x) = E_3 \in_3 (x) = E_3 \frac{h_1 + 2h_2 + h_3}{2\rho(x)}. \quad (23)$$

With (17), (22) and (23), one can get the electric displacement in PVDF, $$D_3(x) = d_{31}\sigma_3(x) = E_3 d_{31} \frac{h_1 + 2h_2 + h_3}{2} \frac{F(L_2 - x)}{\sum_{i=0}^{3} E_i I_i}. \quad (24)$$

The total charge generated in the PVDF can be written as $$Q_f = \int_0^{L_2} D_3(x) W_2 \, dx = \frac{d_{31} E_3 W_2 L_2^2 (h_1 + 2h_2 + h_3)}{4 \sum_{i=0}^{3} E_i I_i} F \quad (25)$$

Then sensitivity of the force sensor is $$S_f = \frac{Q_f}{F} = \frac{d_{31} E_3 W_2 L_2^2 (h_1 + 2h_2 + h_3)}{4 \sum_{i=0}^{3} E_i I_i}. \quad (26)$$

Relevant parameters for the force sensor in our prototype can be found in table above. Theoretical value of $S_f$ is computed to be 0.456 pC/μN, which is close to the actual value 0.459 pC/μN from measurement. With the charge amplifier circuit, the sensitivity of the overall force sensor $$\frac{v_{0f}}{F}$$

at high frequencies (several Hz and above) is characterized to be 0.68 mV/μN, compared to the model prediction of 0.67 mV/μN.

The integrated IPMC/PVDF sensory actuator and the charge sensing circuits may be placed in conductive plastic enclosures (Hammond Manufacturing) to shield electromagnetic interference (EMI) and reduce air disturbance and thermal drift. A slit may be created on the side of the shielding box enclosing IPMC/PVDF so that the end-effector protrudes out for manipulation purposes.

The robustness of the proposed sensory actuator may be verified with respect to the following undesirable factors: 1) feedthrough of actuation signal, 2) thermal drift and other environmental noises, and 3) asymmetric PVDF sensing responses during compression versus tension. The discussion will be focused on the PVDF sensor for IPMC bending output, since the problems associated with the PVDF force sensor are similar and actually simpler (no need to worry about actuation feedthrough).

Figure 22:
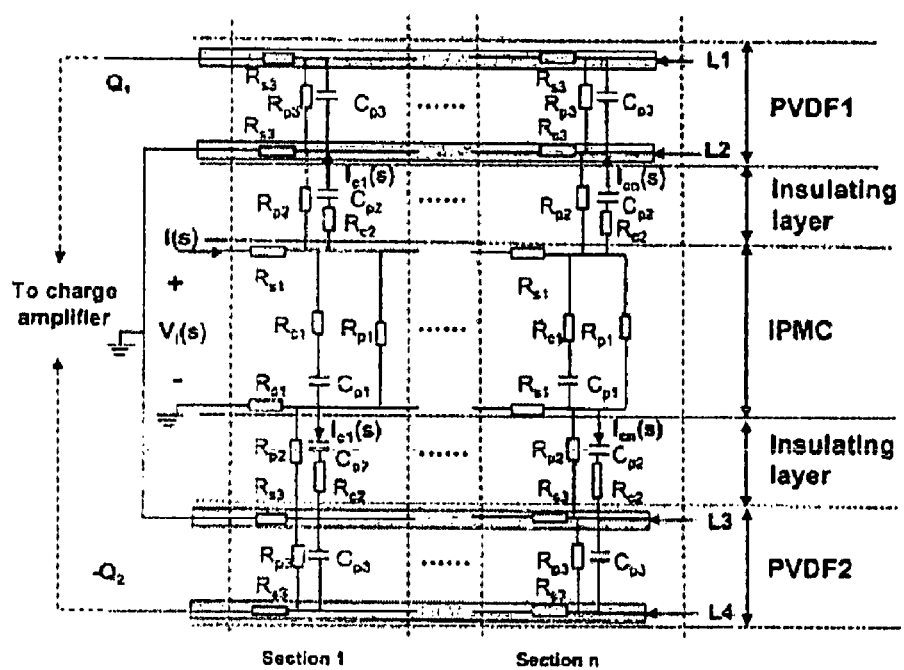
FIG. 22 is schematic of a distributed circuit model for the sensory actuator.

Close proximity between IPMC and PVDF results in capacitive coupling between the two. FIG. 22 illustrates the distributed circuit model for the composite IPMC/PVDF beam. Suppose an actuation signal $V_i(s)$ is applied to IPMC. If one connects both sides of a single PVDF film to a differential charge amplifier, the output will pick up a signal that is induced by the actuation signal via electrical coupling. This feedthrough effect distorts the bending-induced charge output. While one can attempt to model the feedthrough coupling and cancel it through feedforward compensation, the complexity of such algorithms and the varying behavior of coupling make this approach unappealing to certain applications.

In the new charge sensing scheme proposed in this disclosure, the inner sides of the two PVDF sensors are connected to a common ground (see FIG. 18). Since the surface electrode resistances of PVDF films are very low (<0.1Ω, the inner layers $L_2$ and $L_3$ in FIG. 22 will effectively play a shielding role and eliminate the feedthrough coupling signals. This analysis is verified experimentally, where a square-wave actuation voltage with amplitude 2 V and frequency 0.1 Hz is applied to the IPMC. FIGS. 23A and 23B shows that the charge amplifier output $V_O$ contains no feedthrough-induced spikes and it correlates well with the actual bending displacement as observed by the laser distance sensor.

PVDF sensors are very sensitive to ambient temperatures and electromagnetic noises. Such environmental noises could significantly limit the use of PVDF bending/force sensors, especially when the operation frequency is low (comparing with the fluctuation of ambient conditions). Referring to FIG. 18, let noise-induced charges be $Q_{n1}$ and $Q_{n2}$ for PVDF1 and PVDF2, respectively. Suppose that no actuation signal is applied, and thus bending-induced charge $Q(s)=0$. The voltage signals can then be expressed as $$V_p+(s) = -\frac{R_1 s}{1+R_1 C_1 s} Q_{n1}(s),$$

$$V_p-(s) = -\frac{R_1 s}{1+R_1 C_1 s} Q_{n2}(s),$$

$$V_0(s) = \frac{R_1 R_3 s}{R_2(1+R_1 C_1 s)}(Q_{n1}(s) - Q_{n2}(s)).$$

Inside a conductive shielding enclosure, thermal and EMI conditions are relatively steady and uniform. This implies $Q_{n1}(s) \cong Q_{n2}(s)$ and the influence of environmental noises on the sensor output $V_O$ is negligible.

Two experiments have been conducted to confirm the above analysis. In order to isolate the effect to noises, no actuation signal is applied. In the first experiment, the IPMC/PVDF beam was exposed to ambient air flows and electromagnetic noises. In this case, FIG. 24A shows that $Q_{n1} \neq Q_{n2}$ and $V_O \neq 0$. In the second experiment, the IPMC/PVDF sensory actuator was placed inside the conductive shielding enclosure. It can be seen clearly from FIG. 24B that in this case $Q_{n1} \cong Q_{n2}$, and consequently, $V_O$ remained under 1 mV compared to about 20 mV in the first case. This indicates that the proposed differential sensing scheme, together with the shielding enclosure, can effectively minimize the effect of thermal drift and other common noises.

Due to its compliant nature, a single PVDF film does not produce symmetric charge responses when it is under tension versus compression. In particular, it is more sensitive during tension. The asymmetric responses can be seen from the behavior of $V_p+$ or $V_p-$ in FIG. 25A, where a 0.2 Hz, 1 V sinusoidal actuation signal was applied. With the differential configuration of two PVDF films, however, the asymmetric responses of individual PVDF films combine to form a symmetric output. This is because when one film is in compression, the other is in tension. As seen from FIG. 25B, the sensor output $V_O$ has symmetric shape and correlates well with the actual displacement measured with the laser sensor. Note that the problem of asymmetric tension/compression sensing response could also be solved by prestretching PVDF when bonding it to IPMC, but this would increase the fabrication complexity significantly and it would be difficult to achieve the same amount of pre-tension for both films.

Another advantage of adopting two complementary PVDF films is that it alleviates the effect of internal stresses at bonding interfaces. When bonding a single PVDF to IPMC, mismatch of internal stresses at the PVDF/IPMC interface could lead to delamination and/or spontaneous creep of the composite beam. While this problem could be lessened by using appropriate bonding technologies, it was found that the proposed scheme can effectively maintain the structural stability of the composite beam, without stringent requirements on bonding.

The practical utility of the proposed IPMC/PVDF sensory actuator has been demonstrated in feedback control experiments. Trajectory tracking experiments are first performed, where no tip interaction force is introduced. Simultaneous trajectory tracking and force measurement are then conducted to examine both integrated bending and force sensors.

FIG. 26 illustrates the closed-loop system for the control of IPMC bending displacement. Here P(s) represents the actuation dynamics for the IPMC/PVDF composite structure, H(s) is the bending sensor dynamics, K(s) is the controller, r is the reference input, u is the actuation voltage, and $z_2$ is the bending displacement of the end-effector. In experiments data acquisition and control calculation are performed by a dSPACE system (DS1104, dSPACE Inc.); for real applications, such tasks can be easily processed by embedded processors, e.g., microcontrollers. A laser sensor is used as an external, independent observer for verification purposes.

In general K(s) can be designed based on a nominal model of the plant P(s) and various objectives and constraints. Exemplary $H_\infty$ control designs are generally known. Since control design is not the focus of this disclosure, we have picked a simple proportional-integral (PI) controller for K(s) to validate the integrated sensing scheme. The plant model is empirically identified as:

$$P(s) = \frac{2.7s+20}{1000(s^2+33.4s+18.9)}. \tag{27}$$

The sensing model is obtained from (15) and (19):

$$H(s) = \frac{18150s}{6.57s+1}. \tag{28}$$

The following reference trajectory is used: $r(t)=\sin(0.3\pi)$ mm. Based on the models and the reference, a PI controller $$K(s) = 1000\left(40 + \frac{30}{s}\right)$$

is designed to achieve good tracking performance while meeting the constraint |u|<2 V. FIG. 27A shows the experimental results of tracking the bending reference. It can be seen that the PVDF sensor output tracks the reference well; furthermore, the actual bending displacement, as observed by the laser sensor, has close agreement with the PVDF output. The actuation voltage u, shown in FIG. 27B, falls within the limit [−2,2] V. Other types of controllers are contemplated by this disclosure.

It is desirable in many applications to have both displacement and force feedback. With the proposed IPMC/PVDF sensory actuator, one can perform feedback control of the displacement while monitoring the force output, as well as perform feedback control of the force output while monitoring the displacement. In the following experiment, we will demonstrate the feedback bending control with simultaneous force measurement.

Figure 29:
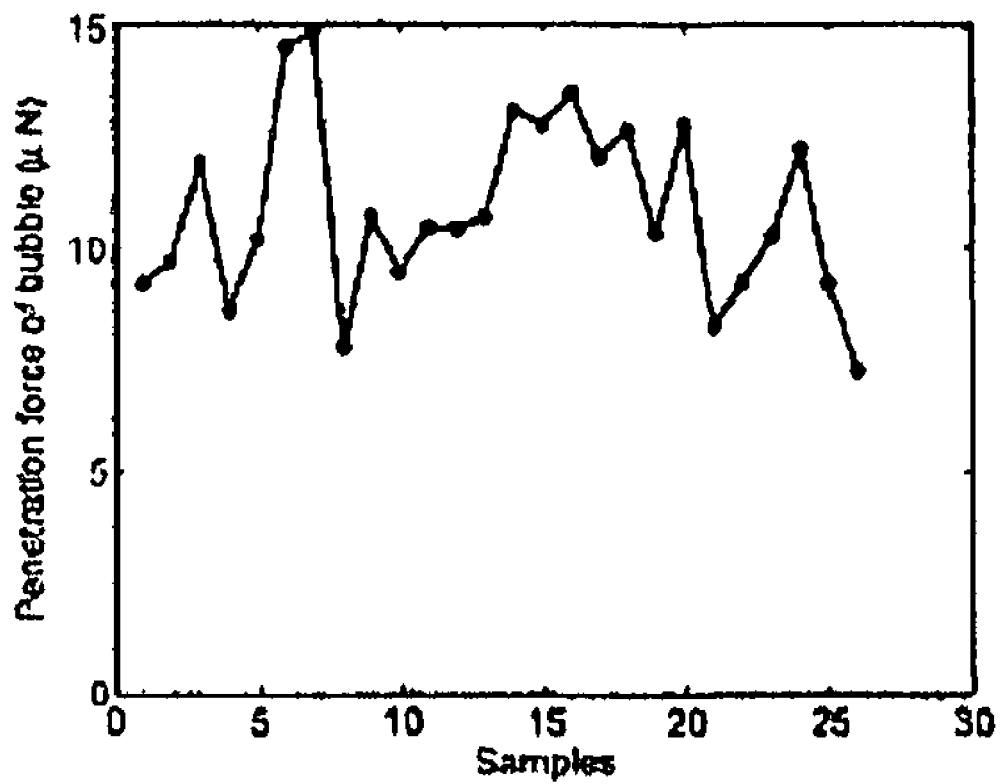
FIG. 29 is a graph showing the measured forces during the measurement sequence.

To mimic the force level often encountered in bio and micromanipulation applications, we have attached a sharp glass needle as an end-effector at the tip of force-sensing beam and used it to pierce soap bubbles. A number of bubble-penetrating experiments were conducting to get an estimate of the rupture force by moving a bubble manually towards the needle until it breaks, when no actuation voltage was applied. FIG. 28 shows the force sensor response during a typical run. It can be seen that the response first rises from zero to a peak value and then starts decayed oscillations. Since the PVDF sensor measures essentially the bending of the passive beam, its output can be interpreted as an interaction force only when the end-effector is in contact with a foreign object. Thus for the response in FIG. 28, only the first rising segment truly represents the force, after which the membrane ruptures and the beam starts oscillating. Hence we take the peak value of such responses as the penetration force. FIG. 29 shows the penetration force measured in 26 independent experiments. Overall the measurements are consistent with an average 11 µN. The variation is believed due to the randomly created bubbles that might have different thicknesses. Note that for many real applications, such as microinjection of embryos or cells, the end-effector will maintain contact with the object under manipulation, in which case the output of PVDF force sensor would truly represent the interaction force at all times.

A feedback bending control experiment with force monitoring has been conducted, where the reference for the bending displacement r(t)=0.2 sin(0.4 π) mm. During the experiment, the end-effector penetrated two soap bubbles at t=9.32 and t=15.72 seconds, respectively. FIG. 30A shows that the bending displacement of IPMC follows closely the reference trajectory, with slight perturbations at the moments penetrations occur. FIG. 30B shows the output of the integrated force sensor, where the two penetrations were captured clearly. The control output (actuation voltage) is shown in FIG. 30C, where one can clearly see that feedback is in action to suppress the disturbance caused by penetration.

Figure 31:
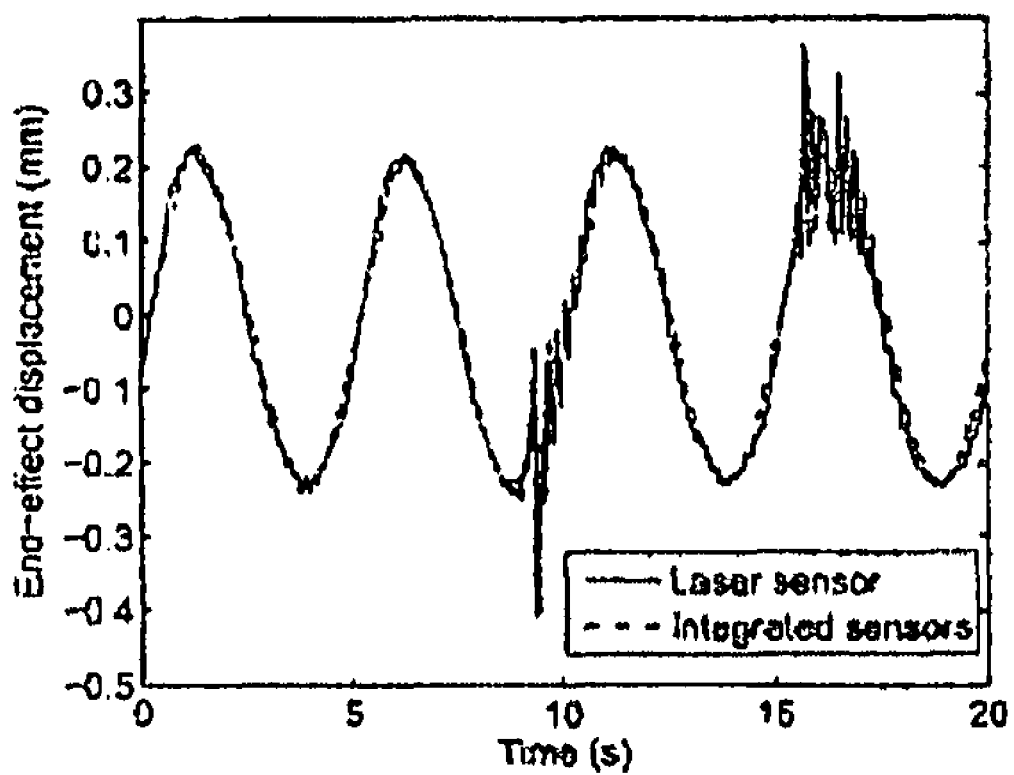
FIG. 31 is a graph comparing an estimated end-effector displacement with that observed by a laser sensor.

Note that the displacement $z_2$ predicted by the PVDF sensor sandwiching IPMC captures only the bending of IPMC while assuming the force-sensing beam is not deflected. This is, of course, not true when the end-effector interacts with objects. To obtain the true displacement of the end-effector, one can combine the bending sensor output $z_2$ and the force sensor output F:

$$d=z_2+F/k, \quad (29)$$

where k is the stiffness of the force-sensing beam. For our prototype, k=0.067 N/m. FIG. 31 compares the end-effector displacement obtained from (29) and that observed by the laser sensor, which shows that indeed the end-effector position can be monitored with the integrated sensors.

In this disclosure a novel scheme was proposed for implementing integrated sensors for an IPMC actuator, to achieve sensing of both the bending displacement output and the force output. In the design two thin PVDF films are bonded to both sides of an IPMC beam to measure the bending output, while a passive beam sandwiched by two PVDF films is attached at the end of IPMC actuator to measure the force experienced by the end-effector. The differential configuration adopted in both sensors has proven critical in eliminating feedthrough coupling, rejecting sensing noises induced by thermal drift and EMI, compensating asymmetric tension/compression responses, and maintaining structural stability of the composite beams. For the first time, feedback control of IPMC was successfully demonstrated using only integrated sensors, showing that one can simultaneously regulating/tracking the bending displacement and monitoring the force output (or vice versa).

The above description is merely exemplary in nature and is not intended to limit the present disclosure, application, or uses.

What is claimed is:

1. A sensori-actuator, comprised:
   an actuating member made of an ionic polymer-metal composite;
   a sensing member made of a piezoelectric material; and
   an insulating member interposed between the actuating member and the sensing member.

2. The sensori-actuator of claim 1 wherein the sensing member is further defined as a polyvinylidene fluoride.

3. The sensori-actuator of claim 1 wherein the insulating member is further defined as a polyvinyl chloride film.

4. The sensori-actuator of claim 1 wherein the actuating member is bonded to the insulating member using an epoxy.

5. The sensori-actuator of claim 1 wherein the actuating member is adapted to receive an actuating signal.

6. The sensori-actuator of claim 1 further comprises an output circuit electrically coupled to the sensing member to output a sensed signal indicative of actuation experienced by the actuating member.

7. The sensori-actuator of claim 6 wherein the output circuit includes a charge amplifier circuit electrically coupled to the sensing member.

8. The sensori-actuator of claim 6 further comprises a compensation circuit adapted to receive the sensed signal and actuation signal, and operable to compensate the sensed signal for feedthrough coupling between the actuating member and the sensing member.

9. The sensori-actuator of claim 8 wherein the compensation circuit determines coupling charge experienced by the sensing member and subtracts the coupling charge from the sensed signal to derive a compensated sensed signal.

10. The actuator of claim 8 wherein the compensation circuit employs a coupling model which accounts for surface resistance of the actuating member, resistance and capacitance between the actuating member and the sensing member, surface resistance of the sensing member, and the resistance and capacitance between electrodes of the sensing member.

11. The actuator of claim 9 wherein the compensation circuit's parameters are estimated by measuring the electrical impedances of actuating member, insulating member and sensing member.

12. The actuator of claim 9 wherein the compensation algorithm is based on the transfer function derived from the compensation circuit and further reduced to the low order system which can be used in real time compensation.

13. A sensori-actuator, comprised:
an actuating member made of an ionic polymer-metal composite and adapted to receive an actuating signal;
a sensing member made of a piezoelectric material and operable to output a sensed signal;
an insulating member interposed between the actuating member and the sensing member; and
a compensation circuit adapted to receive the sensed signal and actuation signal and operable to compensate the sensed signal for feedthrough coupling between the actuating member and the sensing member.

14. The sensori-actuator of claim 13 wherein the compensation circuit determines coupling charge experienced by the sensing member and subtracts the coupling charge from the sensed signal to derive a compensated sensed signal.

15. The sensori-actuator of claim 13 wherein the compensation circuit employs a coupling model which accounts for surface resistance of the actuating member, resistance and capacitance between the actuating member and the sensing member, surface resistance of the sensing member, and the resistance and capacitance between electrodes of the sensing member.

16. A sensory actuator, comprised:
an actuating member in a form of a plate and made of an ionic polymer-metal composite;
two sensing members made of a piezoelectric material and disposed on opposing longitudinal surfaces of the actuating member from each other; and
an insulating layer interposed between each of the sensing members and the actuating member.

17. The sensory actuator of claim 16 wherein the sensing members are further defined as a polyvinylidene fluoride.

18. The sensory actuator of claim 16 wherein the insulating layers are further defined as a polyvinyl chloride film.

19. The sensory actuator of claim 16 wherein the actuating member is bonded to the insulating member using an epoxy.

20. The sensory actuator of claim 16 wherein the actuating member is adapted to receive an actuating signal.

21. The sensory actuator of claim 16 further comprises an output circuit electrically coupled to the sensing members to output a sensed signal indicative of actuation experienced by the actuating member.

22. The sensory actuator of claim 21 wherein the output circuit includes a differential charge amplifier circuit electrically coupled to the two sensing members.

23. The sensory actuator of claim 22 wherein the output circuit is coupled to the outwardly facing surfaces of the sensing members and the inwardly facing surfaces are coupled to a common ground.

24. The sensory actuator of claim 16 further comprises a force sensor in a form of a plate which extends lengthwise from an end of the actuating member so that longitudinal surfaces of the actuating member and force sensor are substantially coplanar with each other.

25. The sensory actuator of claim 24 wherein the force sensor further comprises a passive layer sandwiched by two piezoelectric layers.

26. The sensory actuator of claim 25 wherein the passive layer is comprised of a polyester material and the piezoelectric layers are further defined as a polyvinylidene fluoride.

27. The sensory actuator of claim 25 wherein the piezoelectric layers are bonded directly to the passive layer using an adhesive.

28. A sensing apparatus, comprising:
a sensory actuator in a form of a plate which extends lengthwise away from a connection point to a manipulation device, where the sensory actuator is comprised of an actuating layer made of an ionic polymer-metal composite sandwiched by two piezoelectric layers; and
a force sensor in a form of a plate which extends lengthwise from an end of the sensory actuator such that longitudinal surfaces of the sensory actuator and the force sensor are substantially coplanar with each other, where the force sensor is comprised of a passive layer sandwiched by two piezoelectric layers.

29. The sensory actuator of claim 28 wherein the piezoelectric layers are further defined as a polyvinylidene fluoride.

30. The sensory actuator of claim 28 wherein the actuating layer is adapted to receive an actuating signal.

31. The sensory actuator of claim 28 further comprises an output circuit electrically coupled to the piezoelectric layers of the sensory actuator to output a sensed signal indicative of actuation experienced by the actuating layer.

32. The sensory actuator of claim 31 wherein the output circuit includes a differential charge amplifier circuit electrically coupled to the piezoelectric layers of the sensory actuator.

* * * * *

UNITED STATES PATENT AND TRADEMARK OFFICE
CERTIFICATE OF CORRECTION

PATENT NO. : 7,982,375 B2  Page 1 of 1
APPLICATION NO. : 12/519099
DATED : July 19, 2011
INVENTOR(S) : Xiaobo Tan et al.

It is certified that error appears in the above-identified patent and that said Letters Patent is hereby corrected as shown below:

Column 7, line 25, "$C_{p1}$" should be --$C_{p2}$--.

Column 9, line 11, "pene" should be --penetrated and--.

Column 15, line 59, after "displacement", insert --d--.

Signed and Sealed this
Twenty-second Day of November, 2011

David J. Kappos
*Director of the United States Patent and Trademark Office*

UNITED STATES PATENT AND TRADEMARK OFFICE
CERTIFICATE OF CORRECTION

PATENT NO. : 7,982,375 B2  
APPLICATION NO. : 12/519099  
DATED : July 19, 2011  
INVENTOR(S) : Xiaobo Tan et al.

It is certified that error appears in the above-identified patent and that said Letters Patent is hereby corrected as shown below:

In the Specification

Column 1, line 15 under GOVERNMENT RIGHTS delete "The U.S. Government may have a paid-up license in this invention, and may have the right, in limited circumstances, to require the patent owner to license others on reasonable terms as identified by the terms of Federal Grant Nos. CMS 0550651 and ECS 0547131 awarded by the National Science Foundation." and insert therefor: --This invention was made with government support under CMS0550651 and ECS0547131 awarded by the National Institutes of Health. The government has certain rights in the invention.--

Signed and Sealed this  
Tenth Day of June, 2014

Michelle K. Lee  
*Deputy Director of the United States Patent and Trademark Office*

UNITED STATES PATENT AND TRADEMARK OFFICE
CERTIFICATE OF CORRECTION

PATENT NO.        : 7,982,375 B2
APPLICATION NO.   : 12/519099
DATED             : July 19, 2011
INVENTOR(S)       : Xiaobo Tan et al.

It is certified that error appears in the above-identified patent and that said Letters Patent is hereby corrected as shown below:

In the Specification

Column 1, line 15 under GOVERNMENT RIGHTS delete "This invention was made with government support under CMS0550651 and ECS0547131 awarded by the National Institutes of Health. The government has certain rights in the invention." and insert therefor: --This invention was made with government support under CMS0550651 and ECS0547131 awarded by the National Science Foundation. The government has certain rights in the invention.--

This certificate supersedes the Certificate of Correction issued June 10, 2014.

Signed and Sealed this
First Day of March, 2016

Michelle K. Lee
*Director of the United States Patent and Trademark Office*